US012598900B2

(12) United States Patent
Jung et al.

(10) Patent No.: US 12,598,900 B2
(45) Date of Patent: Apr. 7, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Yangho Jung, Yongin-si (KR); Kabjong Seo, Yongin-si (KR); Junho Sim, Yongin-si (KR); Jaehun Lee, Yongin-si (KR); Taewook Kang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 345 days.

(21) Appl. No.: 18/321,727

(22) Filed: May 22, 2023

(65) Prior Publication Data
US 2024/0057459 A1 Feb. 15, 2024

(30) Foreign Application Priority Data
Aug. 12, 2022 (KR) ........................ 10-2022-0101587

(51) Int. Cl.
*H10K 59/80* (2023.01)
*H10K 59/12* (2023.01)

(52) U.S. Cl.
CPC ..... *H10K 59/8792* (2023.02); *H10K 59/1201* (2023.02)

(58) Field of Classification Search
CPC ............. H10K 59/1201; H10K 59/878; H10K 59/8792
See application file for complete search history.

(56) References Cited

U.S. PATENT DOCUMENTS

| | | | |
|---|---|---|---|
| 7,019,801 B2 | 3/2006 | Ueki et al. | |
| 8,213,082 B2 | 7/2012 | Gaides et al. | |
| 10,680,052 B2 | 6/2020 | Lee et al. | |
| 11,036,321 B2 | 6/2021 | Lee et al. | |
| 2010/0271721 A1 | 10/2010 | Gaides et al. | |
| 2020/0035770 A1* | 1/2020 | Jiang | H10K 50/856 |
| 2020/0168844 A1* | 5/2020 | Kim | H10K 59/12 |
| 2021/0031626 A1 | 2/2021 | Kim et al. | |
| 2021/0036263 A1* | 2/2021 | Kim | H10K 50/86 |

(Continued)

FOREIGN PATENT DOCUMENTS

| | | |
|---|---|---|
| CN | 113130538 | 7/2021 |
| JP | 6345732 | 6/2018 |

(Continued)

*Primary Examiner* — Shaun M Campbell
(74) *Attorney, Agent, or Firm* — F. CHAU & ASSOCIATES, LLC

(57) ABSTRACT

A display apparatus includes a substrate. A display element is disposed on the substrate. A first organic layer is disposed on the display element and includes a plurality of first organic patterns. The plurality of first organic patterns extends in a first direction and has reverse-graded sidewalls. A plurality of first light-shielding walls is disposed on sidewalls of the plurality of first organic patterns. A second organic layer is disposed on the first organic layer and includes a plurality of second organic patterns. The plurality of second organic patterns extends in the first direction and has sidewalls with alternating directions of inclination. A plurality of second light-shielding walls is disposed at sidewalls of the plurality of second organic patterns.

20 Claims, 12 Drawing Sheets

(56)       References Cited

U.S. PATENT DOCUMENTS

| | | | | |
|---|---|---|---|---|
| 2021/0167145 A1* | 6/2021 | Gong | ................... | H10K 59/126 |
| 2021/0217831 A1* | 7/2021 | Jung | ................... | H10K 59/122 |
| 2022/0004017 A1 | 1/2022 | Choi et al. | | |
| 2022/0157904 A1* | 5/2022 | Yun | ...................... | H10K 59/878 |
| 2023/0106236 A1* | 4/2023 | Wen | ...................... | H10K 71/00 |
| | | | | 257/40 |

FOREIGN PATENT DOCUMENTS

| | | |
|---|---|---|
| JP | 3393461 | 4/2023 |
| KR | 10-2002-0037443 | 5/2002 |
| KR | 10-2018-0084333 | 7/2018 |
| KR | 10-2019-0075197 A | 7/2019 |
| KR | 10-2019-0141928 | 12/2019 |
| KR | 10-2020-0012681 | 2/2020 |
| KR | 10-2021-001623 | 2/2021 |
| KR | 10-2021-0016222 | 2/2021 |
| KR | 10-2022-0004262 | 1/2022 |

* cited by examiner

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2022-0101587, filed on Aug. 12, 2022 in the Korean Intellectual Property Office, the disclosure of which is incorporated by reference herein in its entirety.

TECHNICAL FIELD

The present disclosure relates to a display apparatus and, more specifically, to a display apparatus having organic patterns with inclined sidewalls and a method of manufacturing the display apparatus.

DISCUSSION OF THE RELATED ART

Recently, display apparatuses have been used for various purposes. As display apparatuses have become thinner and lighter in weight, the range of use of display apparatuses has been extended. Also, as display apparatuses have been used in various fields, demand for display apparatuses capable of providing a high-quality image is increasing. Recently, display apparatuses have been increasingly used within vehicles so that an image may be provided to a user sitting in a driver's seat or a passenger seat.

SUMMARY

A display apparatus includes a substrate, a display element disposed on the substrate, a first organic layer disposed on the display element and including a plurality of first organic patterns, the plurality of first organic patterns extending in a first direction and having reverse-graded sidewalls, a plurality of first light-shielding walls disposed on sidewalls of the plurality of first organic patterns, a second organic layer disposed on the first organic layer and including a plurality of second organic patterns, the plurality of second organic patterns extending in the first direction and having sidewalls with alternating directions of inclination, and a plurality of second light-shielding walls disposed at sidewalls of the plurality of second organic patterns.

The plurality of first organic patterns and the plurality of second organic patterns may be disposed in a staggered manner in a second direction crossing the first direction.

The first organic layer may include a first groove disposed between adjacent first organic patterns and having a bottom surface that is concave with respect to an upper surface of the plurality of first organic patterns, and first light-shielding walls disposed on sidewalls of the adjacent first organic patterns may cover part of the bottom surface of the first groove.

The second organic layer may fill the first groove.

The second organic layer may include a second groove disposed between adjacent second organic patterns and having a bottom surface that is concave with respect to an upper surface of the plurality of second organic patterns, and second light-shielding walls disposed on sidewalls of the adjacent second organic patterns may cover part of the bottom surface of the second groove.

The bottom surface of the second groove may include an upper surface of the first organic pattern.

The first light-shielding wall and the second light-shielding wall may include a metal oxide.

A slope formed by each of the sidewalls of the plurality of first organic patterns and the sidewalls of the plurality of second organic patterns with respect to an upper surface of the substrate may be 70° or more.

The display apparatus may further include a light-transmitting layer disposed on the second organic layer.

When viewed from a direction perpendicular to the substrate, the plurality of first light-shielding walls and the plurality of second light-shielding walls may overlap each other.

A method of manufacturing a display apparatus includes preparing a substrate on which a display element is disposed, forming a first organic layer on the display element, the first organic layer including a plurality of first organic patterns extending in a first direction and having reverse-graded sidewalls, forming a first light-shielding layer covering the plurality of first organic patterns, forming a plurality of first light-shielding layers on the sidewalls of the plurality of first organic patterns by etching the first light-shielding layer, forming a second organic layer on the first organic layer, the second organic layer including a plurality of second organic patterns extending in the first direction and having sidewalls with alternating directions of inclination, forming a second light-shielding layer covering the plurality of second organic patterns, and forming a plurality of second light-shielding walls on the sidewalls of the plurality of second organic patterns by etching the second light-shielding layer.

The first organic layer may include a first groove disposed between adjacent first organic patterns and having a bottom surface that is concave with respect to an upper surface of the first organic patterns, and in the forming of the second organic layer, the second organic layer may fill the first groove.

First light-shielding walls disposed on sidewalls of the adjacent first organic patterns may cover part of the bottom surface of the first groove.

The plurality of first organic patterns and the plurality of second organic patterns may be disposed in a staggered manner in a second direction crossing the first direction.

The second organic layer may include a second groove disposed between adjacent second organic patterns and having a bottom surface that is concave with respect to an upper surface of the second organic patterns, and second light-shielding walls disposed on sidewalls of the adjacent second organic patterns may cover part of the bottom surface of the second groove.

The forming of the first light-shielding wall may include forming a first photoresist layer covering the first light-shielding layer, forming a first photoresist pattern in an area overlapping an upper surface of the first light-shielding layer by using the upper surface of the first light-shielding layer as a mask, etching the first light-shielding layer by using the first photoresist pattern as a mask, and removing the first photoresist pattern.

The forming of the second light-shielding wall may include forming a second photoresist layer covering the second light-shielding layer, forming a second photoresist pattern in an area overlapping an upper surface of the second light-shielding layer by using the upper surface of the second light-shielding layer as a mask, etching the second light-shielding layer by using the second photoresist pattern as a mask, and removing the second photoresist pattern.

Each of the sidewalls of the plurality of first organic patterns and the sidewalls of the plurality of second organic patterns form a slope of 70° or more with respect to an upper surface of the substrate.

The first light-shielding layer and the second light-shielding layer may include a metal oxide.

The method may further include forming a light-transmitting layer on the second organic layer.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
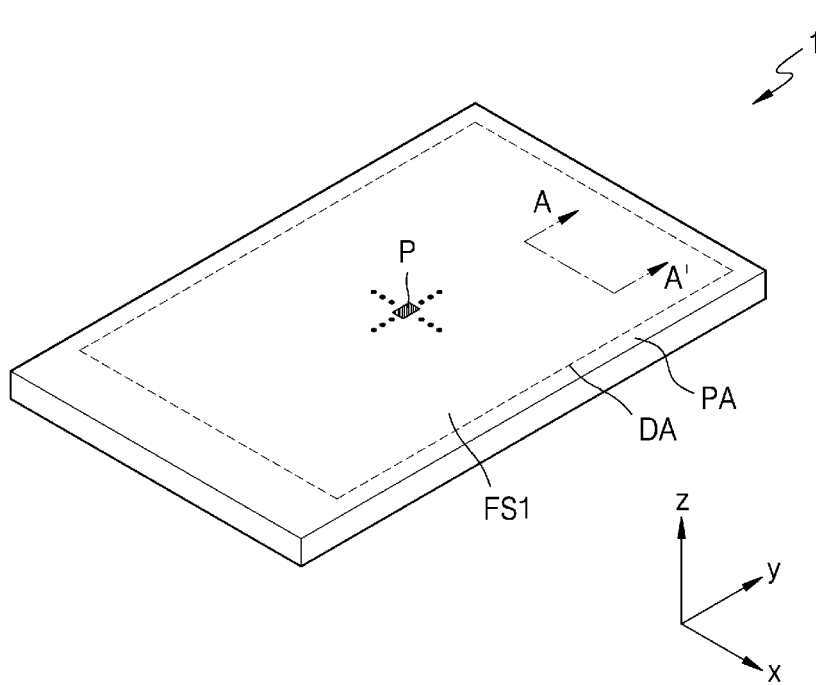
FIG. 1 is a perspective view schematically illustrating a display apparatus according to an embodiment.

Reference will now be made in detail to embodiments, examples of which are illustrated in the accompanying drawings, wherein like reference numerals may refer to like elements throughout the specification and the disclosure. In this regard, the present embodiments may have different forms and should not necessarily be construed as being limited to the descriptions set forth herein. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or any variations thereof.

In the disclosure, terms such as "first" and "second" are used herein merely to describe a variety of elements, but the elements are not necessarily limited by the terms. Such terms may be used for the purpose of distinguishing one element from another element.

In the disclosure, an expression used in the singular encompasses the expression of the plural, unless it has a clearly different meaning in the context.

In the disclosure, terms such as "include" or "comprise" may be construed to denote a certain characteristic or element, or a combination thereof, but might not be construed to exclude the existence of or a possibility of addition of one or more other characteristics, elements, or any combinations thereof.

It will be understood that when a layer, region, or element is referred to as being "formed on" another layer, region, or element, it can be directly or indirectly formed on the other layer, region, or element. That is, for example, intervening layers, regions, or elements may be present.

It will be understood that when a layer, region, or element is referred to as being "connected" to another layer, region, or element, it may be "directly connected" to the other layer, region, or element and/or may be "indirectly connected" to the other layer, region, or element with another layer, region, or element therebetween. For example, it will be understood that when a layer, region, or element is referred to as being "electrically connected" to another layer, region, or element, it may be "directly electrically connected" to the other layer, region, or element and/or may be "indirectly electrically connected" to the other layer, region, or element with another layer, region, or element therebetween.

In the disclosure, "A and/or B" means A or B, or A and B. In addition, "at least one of A and B" means A or B, or A and B.

In the disclosure, the x-axis, the y-axis, and the z-axis are not necessarily limited to three axes of the Cartesian coordinate system, and may be interpreted in a broader sense. For example, the x-axis, the y-axis, and the z-axis may be perpendicular to one another, or may represent different directions that are not perpendicular to one another.

In the disclosure, the term "about" or "approximately" used to refer to any numerical value may mean including numerical values within a range generally accepted in the art due to measurement limits or errors. For example, "about" can mean including values in the range ±30%, ±20%, ±10% or ±5% of any numerical value.

In the disclosure, when an embodiment may be implemented differently, a certain process order may be performed differently from the described order. For example, two consecutively described processes may be performed substantially at the same time or performed in an order opposite to the described order.

Sizes of elements in the drawings may be exaggerated or reduced for convenience of explanation. While each drawing may represent one or more particular embodiments of the present, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

Figure 2:
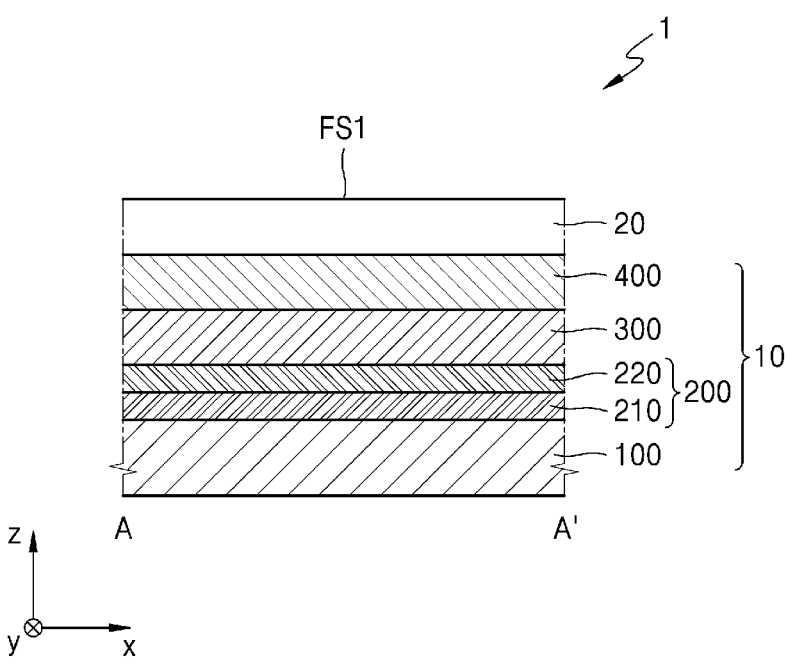
FIG. 2 is a cross-sectional view schematically illustrating a cross-section of the display apparatus, taken along a line A-A' in FIG. 1.

FIG. 1 is a perspective view schematically illustrating a display apparatus 1 according to an embodiment, and FIG. 2 is a cross-sectional view of the display apparatus 1, taken along a line A-A' in FIG. 1.

Referring to FIG. 1, the display apparatus 1, according to an embodiment, may include a display area DA and a peripheral area PA. The peripheral area PA may be disposed outside of the display area DA and may at least partially surround the display area DA. Various lines and a driving circuit unit may be disposed in the peripheral area PA, the various lines and the driving circuit being configured to transfer an electric signal to be applied to the display area DA. The display apparatus 1 may display an image by using light emitted from a plurality of pixels disposed in the display area DA.

Although the display apparatus 1 is described below as an example of an organic light-emitting display apparatus, the display apparatus of the disclosure is not necessarily limited thereto. The display apparatus 1 may be a display apparatus, such as an organic light emitting display, an inorganic light emitting display (or an inorganic electroluminescent (EL) display), or a quantum dot light emitting display.

The display apparatus 1 may be implemented as an electronic device of various types. In an embodiment, the display apparatus 1 may be a display apparatus for a vehicle, but the display apparatus of the disclosure is not necessarily limited thereto.

As shown in FIG. 2, the display apparatus 1 may include a display panel 10 and a cover window 20. The display panel 10 may include a substrate 100, a pixel layer 200, an encapsulation layer 300, and a light-shielding layer 400, which are sequentially stacked in a third direction (e.g., a z direction).

The substrate 100 may include a glass material or polymer resin. For example, the substrate 100 may include a glass material with silicon oxide ($SiO_x$) as a main component, or may include polymer resin, such as polyethersulfone, polyarylate, polyetherimide, polyethylene naphthalate, polyethylene terephthalate, polyphenylene sulfide, polyimide, polycarbonate, cellulose triacetate, and cellulose acetate propionate.

The pixel layer 200 may be disposed on the substrate 100. The pixel layer 200 may include a pixel circuit layer 210 and a display element layer 220, wherein the pixel circuit layer 210 includes pixel circuits and insulating layers, and the display element layer 220 includes display elements. The display element layer 220 may be disposed on the pixel circuit layer 210, and the plurality of insulating layers may be between the pixel circuits of the pixel circuit layer 210 and the display elements of the display element layer 220. Some lines and the insulating layers of the pixel circuit layer 210 may each extend to the peripheral area PA.

The encapsulation layer 300 may be disposed on the pixel layer 200. The encapsulation layer 300 may seal the display elements disposed in the display element layer 220. In an embodiment, the encapsulation layer 300 may include at least one inorganic encapsulation layer and at least one organic encapsulation layer. The at least one inorganic encapsulation layer may include one or more inorganic materials from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include acryl-based resin, epoxy-based resin, polyimide, and polyethylene. In an embodiment, the at least one organic encapsulation layer may include acrylate.

The light-shielding layer 400 may be disposed on the encapsulation layer 300. The light-shielding layer 400 may at least partially absorb external light or internal reflected light, and may serve to limit a viewing angle of light emitted from the display element layer 220. For example, the light-shielding layer 400 may transmit light emitted perpendicular to a front surface FS1 of the display apparatus 1, and block light emitted while forming an angle of about 45° or less with the front surface FS1. The light-shielding layer 400 may be disposed in the display area DA. The light-shielding layer 400 may include a transmissive area such that light emitted by a display element disposed in the display area DA may be transmitted to the outside.

A touch sensor layer may be further included between the encapsulation layer 300 and the light-shielding layer 400. The touch sensor layer, which is a layer for sensing a touch input of a user, may detect the touch input of the user by using various touch methods, such as a resistive film type method and a capacitive type method.

The cover window 20 may be disposed on the display panel 10. In an embodiment, the cover window 20 may be coupled to an element disposed thereunder, for example, the light-shielding layer 400, through an adhesive, such as an optical clear adhesive (OCA). The cover window 20 may protect the display panel 10 from damage and infiltration. The cover window 20 may include glass, sapphire, and/or plastic. For example, the cover window 20 may be ultra-thin glass (UTG) or colorless polyimide (CPI).

Figure 3:
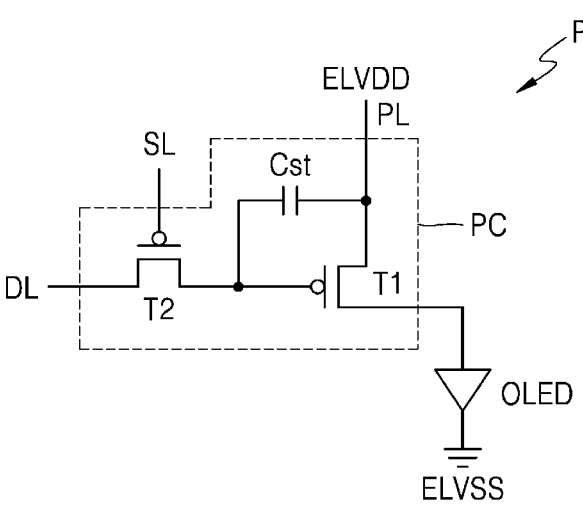
FIG. 3 is an equivalent circuit diagram of a pixel according to an embodiment.
Figure 4:
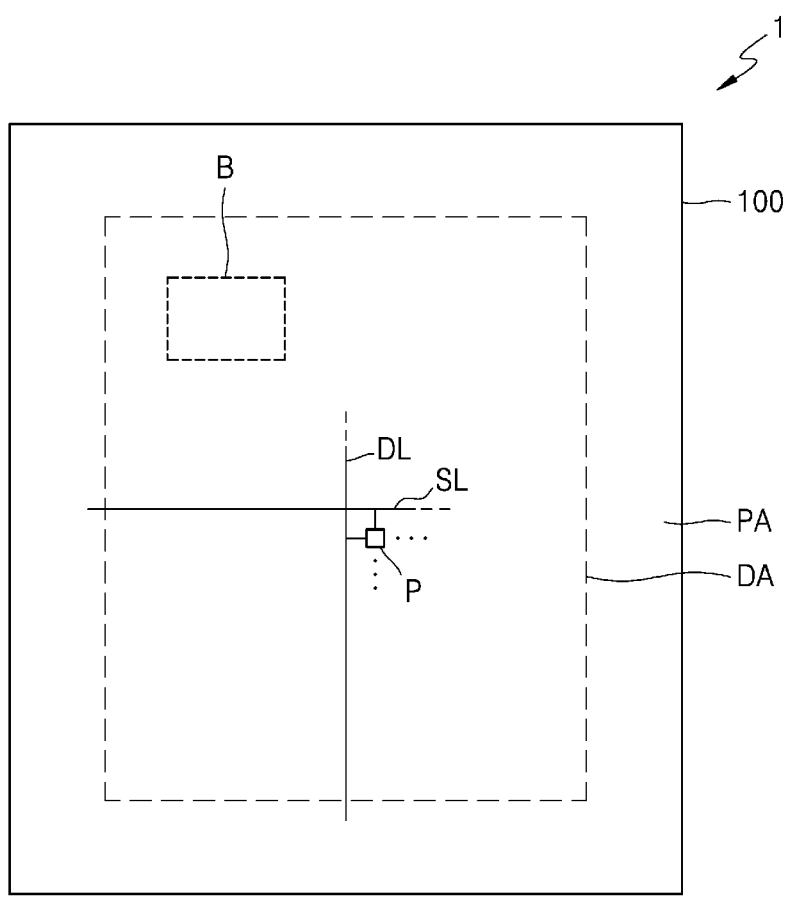
FIG. 4 is a plan view schematically illustrating a display apparatus according to an embodiment.

FIG. 3 is an equivalent circuit diagram of a pixel P according to an embodiment, and FIG. 4 is a plan view schematically illustrating the display apparatus 1 according to an embodiment.

Referring to FIGS. 3 and 4, the substrate 100 of the display apparatus 1 may be divided into the display area DA and the peripheral area PA. The display apparatus 1 may display an image by using light emitted from the plurality of pixels P disposed in the display area DA.

Each of the pixels P may include a display element, such as an organic light emitting diode (OLED) or an inorganic light emitting diode, and may emit, for example, red, green, blue, or white light. For example, each of the pixels P may be connected to a pixel circuit PC, which includes a thin-film transistor TFT, a storage capacitor Cst, and the like. The pixel circuit PC may be connected to a scan line SL, a data line DL, which crosses the scan line SL, and a driving voltage line PL. In an embodiment, the scan line SL may extend in a first direction (e.g., an x direction), and each of the data line DL and the driving voltage line PL may be provided to extend in a second direction (e.g., a y direction).

Each of the pixels P may emit light by driving of the pixel circuit PC, and an image may be displayed from the display area DA through the light emitted from the pixels P. In the disclosure, the pixel P may be defined as an emission area in which any one of red, green, blue, and white light may be emitted, as described above.

The peripheral area PA, which is an area in which the pixels P are not disposed, does not display an image. A terminal unit, to which a printed circuit board including an embedded driving circuit unit, a power supply line, and a driving circuit unit, or a driver integrated circuit (IC) is connected, may be disposed in the peripheral area PA.

An organic light-emitting diode OLED, that is a display element of the pixel P, may be connected to the pixel circuit PC. The pixel circuit PC may include a first thin-film transistor T1, a second thin-film transistor T2, and a storage capacitor Cst. For example, the organic light-emitting diode OLED may emit one of red, green, and blue light or one of red, green, blue, and white light.

The second thin-film transistor T2, which is a switching thin-film transistor, may be connected to the scan line SL and the data line DL and transfer a data voltage received via the data line DL to the first thin-film transistor T1 in response to a switching voltage received via the scan line SL. The storage capacitor Cst, which is connected to the second thin-film transistor T2 and the driving voltage line PL, may store a voltage corresponding to a voltage difference between a voltage received from the second thin-film transistor T2 and a first power voltage ELVDD received via the driving voltage line PL.

The first thin-film transistor T1, which is connected to the driving voltage line PL and the storage capacitor Cst as a driving thin-film transistor, may control a driving current flowing to the organic light-emitting diode OLED from the driving voltage line PL according to the voltage value stored in the storage capacitor Cst. The organic light-emitting diode OLED may emit light having a brightness according to the driving current. An opposite electrode (e.g., a cathode) of the organic light-emitting diode OLED may receive a second power voltage ELVSS.

Figure 5:
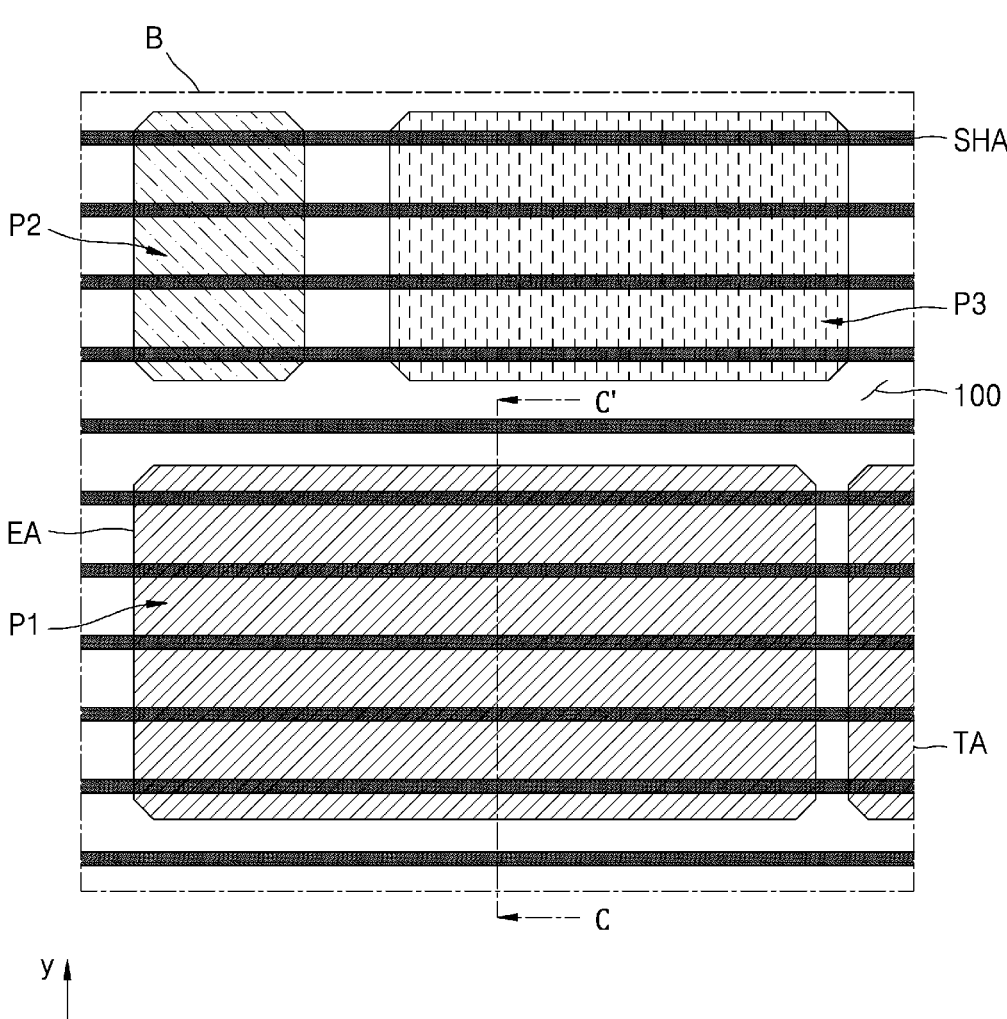
FIG. 5 is an enlarged plan view illustrating a region B of the display apparatus shown in FIG. 4.
Figure 5:
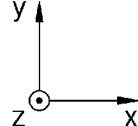

FIG. 5 is an enlarged plan view illustrating a region B of the display apparatus 1 shown in FIG. 4.

Referring to FIG. 5, a first pixel P1, a second pixel P2, and a third pixel P3 may be disposed on the substrate 100. Here, each of the first pixel P1, the second pixel P2, and the third pixel P3 shown in FIG. 5 may be defined by an emission area of a display element thereof.

The first pixel P1 may emit light of a first wavelength band. For example, the first pixel P1 may emit light of a wavelength in a range of 450 nm to 495 nm. The second pixel P2 may emit light of a second wavelength band. For example, the second pixel P2 may emit light of a wavelength in a range of 630 nm to 780 nm. The third pixel P3 may emit light of a third wavelength band. For example, the third pixel P3 may emit light of a wavelength in a range of 495 nm to 570 nm.

Each of the first pixel P1, the second pixel P2, and the third pixel P3 may have a quadrilateral shape among polygons. In the disclosure, a polygon or a quadrilateral may include a shape having round vertices. For example, each of the first pixel P1, the second pixel P2, and the third pixel P3 may have a quadrilateral shape with round vertices. In another embodiment, each of the first pixel P1, the second pixel P2, and the third pixel P3 may have a circular or elliptical shape.

Sizes of the first pixel P1, the second pixel P2, and the third pixel P3 may be different from each other. For example, the second pixel P2 may be smaller in area than the first pixel P1 and the third pixel P3, and the first pixel P1 may be greater in area than the third pixel P3. However, the disclosure is not necessarily limited thereto. The first pixel P1, the second pixel P2, and the third pixel P3 may have substantially the same size as each other, and various modifications may be made.

The first pixel P1 may be provided in plural, and the plurality of first pixels P1 may be disposed apart from each other in the first direction (e.g., the x direction). Each of the second pixel P2 and the third pixel P3 may be provided in plural, and the plurality of second pixels P2 and the plurality of third pixels P3 may be repeatedly disposed apart from each other in the first direction (e.g., the x direction). A pixel row formed by the plurality of first pixels P1 disposed in the first direction (e.g., the x direction) and a pixel row formed by the second pixel P2 and the third pixel P3 alternately disposed in the first direction (e.g., the x direction) may be repeatedly disposed apart from each other in the second direction (e.g., the y direction). However, the disclosure is not necessarily limited thereto, and the first pixel P1, the second pixel P2, and the third pixel P3 may be disposed in various pixel arrangement structures, such as a PENTILE™ structure (a subpixel matrix scheme developed by Samsung), a stripe structure, a mosaic structure, or a delta structure.

The substrate 100 may include a light-shielding area SHA and a transmissive area TA that reflect or absorb light emitted from the first pixel P1, the second pixel P2, and the third pixel P3. The light-shielding area SHA, which is an area in which a light-shielding wall absorbing light is disposed, may extend in the first direction (e.g., the x direction) and overlap the plurality of pixels. The light-shielding area SHA may be provided in plural, and the plurality of light-shielding areas SHA may be disposed apart from each other in the second direction (e.g., the y direction). An area between the adjacent light-shielding areas SHA may be defined as the transmissive area TA. As shown in FIG. 5, one pixel may overlap the plurality of light-shielding areas SHA and a plurality of transmissive areas TA.

The plurality of light-shielding areas SHA may limit a specific direction component of light emitted from the first pixel P1, the second pixel P2, and the third pixel P3. For example, when a component in the second direction (e.g., the y direction) of the light emitted from the first pixel P1, the second pixel P2, and the third pixel P3 exceeds a certain value and has an exit angle of greater than or equal to a cut-off angle, the emitted light may be blocked by the light-shielding area SHA.

Figure 6:
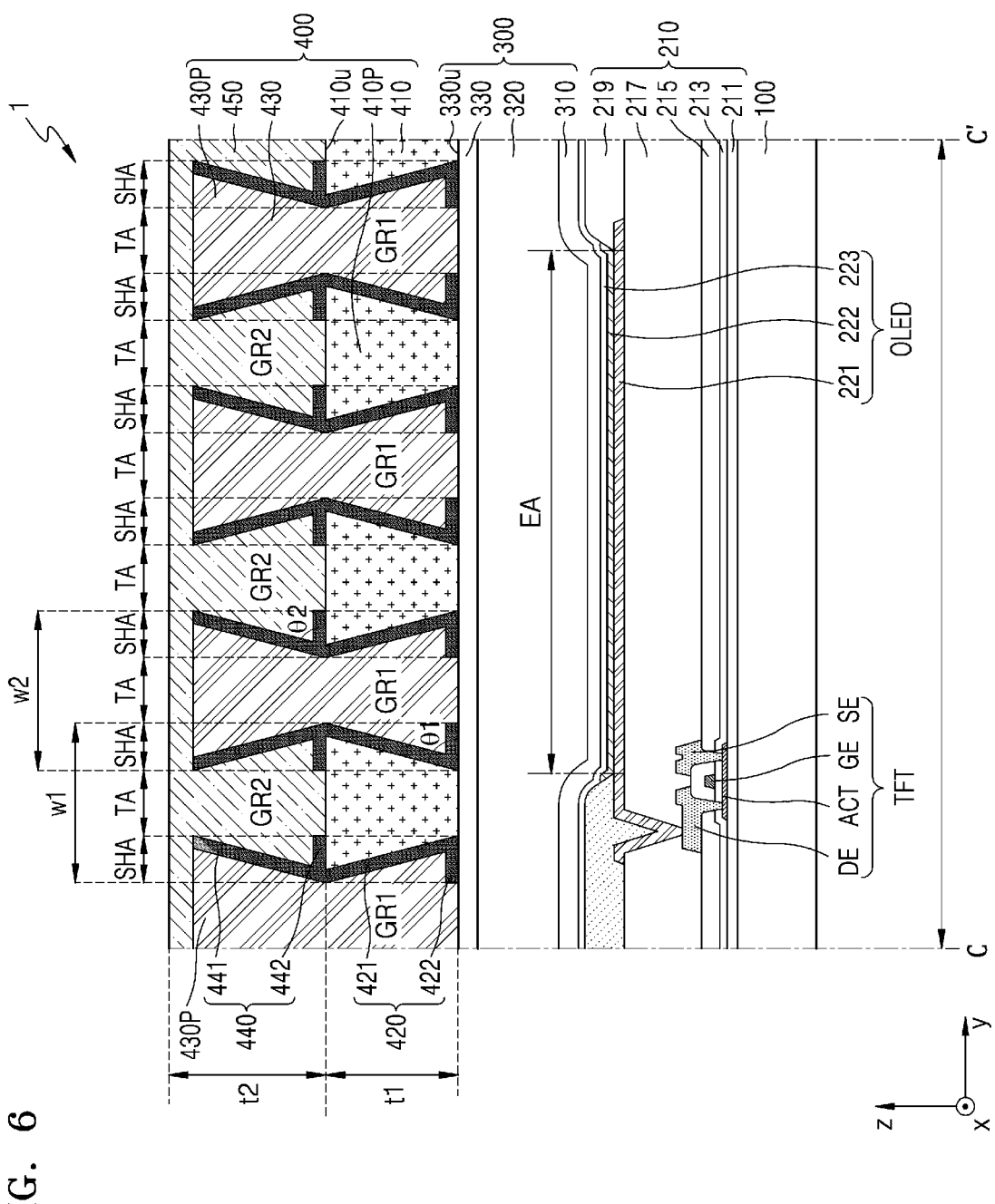
FIG. 6 is a cross-sectional view schematically illustrating a cross-sectional view of the display apparatus, taken along a line C-C' in FIG. 5.

FIG. 6 is a cross-sectional view schematically illustrating a cross-sectional view of the display apparatus 1, taken along a line C-C' in FIG. 5.

Referring to FIG. 6, the display apparatus 1, according to an embodiment, may include the substrate 100, the pixel circuit layer 210, the organic light-emitting diode OLED, which is a display element, the encapsulation layer 300, and the light-shielding layer 400.

As described above, the substrate 100 may include a glass material or a polymer resin. The pixel circuit layer 210 may be disposed on the substrate 100.

The pixel circuit layer 210 may include the thin-film transistor TFT and a storage capacitor. The thin-film transistor TFT may include a semiconductor layer ACT, a gate electrode GE, a source electrode SE, and a drain electrode DE, the semiconductor layer ACT including amorphous silicon, polycrystalline silicon, or an organic semiconductor material. To ensure insulation between the semiconductor layer ACT and the gate electrode GE, a gate insulating layer 213 may be disposed between the semiconductor layer ACT and the gate electrode GE, the gate insulating layer 213 including an inorganic material, such as $SiO_x$, $SiN_x$, and/or SiON.

An interlayer insulating layer including an inorganic material, such as $SiO_x$, $SiN_x$, and/or SiON, may be disposed on the gate electrode GE, and the source electrode SE and the drain electrode DE may be disposed on the interlayer insulating layer 215 described above. The insulating layer including the inorganic material may be formed through CVD or atomic layer deposition (ALD). In an embodiment, any of the source electrode SE and the drain electrode DE may be omitted and may be replaced with the conductive semiconductor layer ACT.

The gate electrode GE, the source electrode SE, and the drain electrode DE may include various conductive materials. The gate electrode GE may include at least one of molybdenum (Mo), aluminum (Al), copper (Cu), and titanium (Ti), and may have a multi-layer structure when necessary. For example, the gate electrode GE may include a single Mo layer or may have a three-layer structure including a Mo layer, an Al layer, and another Mo layer. Each of the source electrode SE and the drain electrode DE may include at least one of Cu, Ti, and Al, and may have a multi-layer structure when necessary. For example, each of the source electrode SE and the drain electrode DE may have a three-layer structure including a Ti layer, an Al layer, and another Ti layer.

A buffer layer 211 may be disposed between the thin-film transistor TFT and the substrate 100, the buffer layer 211 including an inorganic material, such as $SiO_x$, $SiN_x$, and/or SiON. The buffer layer 211 may increase flatness of an upper surface of the substrate 100 or prevent or minimize permeation of impurities into the semiconductor layer ACT of the thin-film transistor TFT from the substrate 100 or the like.

A planarization insulating layer 217 may be disposed on the thin-film transistor TFT. The planarization insulating layer 217 may include an organic material, such as acryl, benzocyclobutene (BCB), or hexamethyldisiloxane (HMDSO). In FIG. 6, the planarization insulating layer 217 is a single layer. However, the planarization insulating layer 217 may include a plurality of layers.

A pixel electrode 221 may be disposed on the planarization insulating layer 217. The pixel electrode 221 may be disposed in each pixel. The pixel electrodes 221 respectively corresponding to adjacent pixels may be disposed apart from each other.

The pixel electrode 221 may be a reflective electrode. In some embodiments, the pixel electrode 221 may include a reflective layer and a transparent or semi-transparent layer formed on the reflective layer, the reflective film including silver (Ag), magnesium (Mg), Al, platinum (Pt), palladium (Pd), gold (Au), nickel (Ni), neodymium (Nd), iridium (Jr), chrome (Cr), and any compounds thereof. The transparent or semi-transparent electrode layer may include at least one material selected from the group consisting of indium tin oxide (ITO), indium zinc oxide (IZO), ZnO, indium oxide (In$_2$O$_3$), indium gallium oxide (IGO), and aluminum zinc oxide (AZO). In some embodiments, the pixel electrode 221 may have a three-layer structure of an ITO layer, an Ag layer, and another ITO layer.

A pixel-defining layer 219 may be disposed on the pixel electrode 221. The pixel-defining layer 219 may include an opening that exposes an upper surface of each pixel electrode 221. The opening of the pixel-defining layer 219 may define an emission area EA of the pixel. The pixel-defining layer 219 may cover an edge of the pixel-defining layer 219, and may increase a distance between the edge of the pixel electrode 221 and an opposite electrode 223, thereby preventing an arc or the like from occurring at the edge of the pixel electrode 221. The pixel-defining layer 219 may include an organic insulating material, such as polyimide, polyamide, acrylic resin, BCB, HMDSO, and phenolic resin, and may be formed by spin coating or the like. Alternatively, the pixel-defining layer 219 may include an inorganic insulating material. Alternatively, the pixel-defining layer 219 may have a multi-layer structure including an inorganic insulating material and an organic insulating material.

In some embodiments, the pixel-defining layer 219 may include a light-shielding material and may be black in color. The light-shielding material may include carbon black, carbon nanotubes, a resin or paste including black dye, metal particles, such as Ni, Al, Mo, and any alloys thereof, metal oxide particles (e.g., chrome oxide), or metal nitride particles (e.g., chrome nitride).

An emission layer 222 may be disposed on the pixel electrode 221. The emission layer 222 may include an organic material including a fluorescent or phosphorous material capable of emitting red, green, or blue light. The organic material described above may be a low-molecular weight organic material or a polymer organic material. The emission layer 222 may be disposed to correspond to the pixel electrode 221.

A first common layer and/or a second common layer may be disposed under and on the emission layer 222, respectively. For example, the first common layer, which is an element disposed under the emission layer 222, may include a hole transport layer (HTL) or may include the HTL and a hole injection layer (HIL). The second common layer, which is an element disposed on the emission layer 222, may include an electron transport layer (ETL) and/or an electron injection layer (EIL). In some embodiments, the second common layer might not be provided.

Similar to the opposite electrode 223, the first common layer and the second common layer may be common layers integrally formed to entirely cover the substrate 100, for example, a display area of the substrate 100.

The opposite electrode 223 may be a cathode that is an electron injection electrode, and in this case, as a material for the opposite electrode 223 a metal having a low work function, an alloy, an electrically conductive compound, or any combinations thereof may be used. The opposite electrode 223 may be a transmissive electrode, a semi-transmissive electrode, or a reflective electrode.

The opposite electrode 223 may include Li, Ag, Mg, Al, Al—Li, calcium (Ca), Mg—In, Mg—Ag, ytterbium (Yb), Ag—Yb, ITO, IZO, or any combinations thereof. The opposite electrode 223 may have a single-layer structure that is a single layer, or may have a multi-layer structure including a plurality of layers.

A capping layer may be further disposed on the opposite electrode 223. The capping layer may increase external luminous efficiency of the organic light-emitting diode according to principle of constructive interference. The capping layer may include a material having a refractive index (at 589 nm) of 1.6 or more. A thickness of the capping layer may be 1 nm to 200 nm, for example, 5 nm to 150 nm, or 10 nm to 100 nm. The capping layer may be an organic capping layer including an organic material, an inorganic capping layer including an inorganic material, or a composite capping layer including an organic material and an inorganic material.

The encapsulation layer 300 sealing the display element may be disposed on the organic light-emitting diode OLED. The encapsulation layer 300 may include at least one inorganic encapsulation layer and at least one organic encapsulation layer. The at least one inorganic encapsulation layer may include one or more inorganic materials from among Al$_2$O$_3$, TiO$_2$, Ta$_2$O$_5$, ZnO, SiO$_2$, SiN$_x$, and SiON. The at least one organic encapsulation layer may include a polymer-based material. The polymer-based material may include acryl-based resin, epoxy-based resin, polyimide, and polyethylene. In an embodiment, the at least one organic encapsulation layer may include acrylate. In FIG. 6, the encapsulation layer 300 includes a first inorganic encapsulation layer 310, a second inorganic encapsulation layer 330, and an organic encapsulation layer 320 disposed between the first inorganic encapsulation layer 310 and the second inorganic encapsulation layer 330. The organic encapsulation layer 320 may cover unevenness of the organic light-emitting diode OLED and provide a flat upper surface.

The light-shielding layer 400 may be disposed on the encapsulation layer 300. The light-shielding layer 400 may include a first organic layer 410, a first light-shielding wall 420, a second organic layer 430, a second light-shielding wall 440, and a light-transmitting layer 450.

The first organic layer 410 may be disposed on the second inorganic encapsulation layer 330. The first organic layer 410 may include a plurality of first organic patterns 410P extending in the first direction (e.g., the x direction) and having reverse-graded sidewalls. For example, the first organic pattern 410P may have a reversely tapered shape. An angle ($\theta$1) formed by a sidewall of the first organic pattern 410P with respect to the upper surface of the substrate 100 may be about 70° or more. For example, the sidewall of the first organic pattern 410P may have a slope of about 70° to about 85° with respect to the upper surface of the substrate 100. The first organic pattern 410P may be provided in plural, and the plurality of first organic patterns 410P may be disposed apart from each other in the second direction (e.g., the y direction).

The first organic layer 410 may be disposed between adjacent first organic patterns 410P and may include a first groove GR1 having a bottom surface that is concave with respect to an upper surface of the first organic layer 410. For example, the first groove GR1 may be defined by the sidewalls of the adjacent first organic patterns 410P and an upper surface 330u of the second inorganic encapsulation layer 330 that is continuous with the sidewalls of the first organic patterns 410P.

The first organic layer 410 may include a light-transmitting organic material. In an embodiment, the first organic layer 410 may include acryl-based resin (e.g., poly(methyl methacrylate), polyacrylic acid, or the like), ethylhexyl acrylate, pentafluoropropyl acrylate, poly(ethylene glycol) dimethacrylate, ethylene glycol dimethacrylate), or the like.

A thickness t1 of the first organic layer 410 may be about 15 μm. For example, the thickness t1 of the first organic layer 410 may be about 10 μm to about 17 μm. A width w1 of the upper surface of the first organic pattern 410P in the second direction (e.g., the y direction) may be about 4 μm. The thickness t1 of the first organic layer 410 and the width w1 of the upper surface of the first organic pattern 410P in the second direction (e.g., the y direction) may be variously modified according to a design.

The first organic pattern 410P may be disposed on the sidewalls of the first organic patterns 410P. For example, the first light-shielding wall 420 may cover a sidewall and a portion of a bottom surface of the first groove GR1. The first light-shielding wall 420 may include a first sidewall portion 421 and a first protruding portion 422, wherein the first sidewall portion 421 covers the sidewalls of the first organic pattern 410P, and the first protruding portion 422 extends from the first sidewall portion 421 toward a central portion of the first groove GR1.

The first light-shielding wall 420 may include a low-reflective material. For example, the first light-shielding wall 420 may include a metal oxide. In an embodiment, the metal oxide may include at least one material selected from among Mo—Ta—O (MTO), copper oxide (CuO), calcium oxide (CaO), molybdenum oxide (MoO$_x$), and ZnO.

In an embodiment, the first light-shielding wall 420 may have a multi-layer structure. For example, the first light-shielding wall 420 may have a structure in which a metal oxide layer and a metal layer are alternately stacked with each other. In an embodiment, the first light-shielding wall 420 may have a multi-layer structure in which an MTO layer, a Mo layer, and another MTO layer are stacked, or a multi-layer structure in which an MTO layer, an Al layer, and another MTO layer are stacked.

The second organic layer 430 may be disposed on the first organic layer 410. The second organic layer 430 may include a plurality of second organic patterns 430P extending in the first direction (e.g., the x direction) and having sidewalls with alternating directions of inclination. The second organic layer 430 may fill the first groove GR1, and the second organic pattern 430P may protrude in the third direction (e.g., the z direction) from an upper surface 410u of the first organic layer 410.

The second organic pattern 430P may have a reversely tapered shape (e.g., a shape that gets wider from bottom-to-top). An angle (θ2) formed by a sidewall of the second organic pattern 430P with respect to the upper surface of the substrate 100 may be about 70° or more. For example, the sidewall of the second organic pattern 430P may have a slope of about 70° to about 85° with respect to the upper surface of the substrate 100. The second organic pattern 430P may be provided in plural, and the plurality of second organic patterns 430P may be disposed apart from each other in the second direction (e.g., the y direction). The second organic pattern 430P and the first organic pattern 410P may be disposed in a staggered manner in the second direction (e.g., the y direction).

The second organic layer 430 may be disposed between adjacent second organic patterns 430P, and may include a second groove GR2 having a bottom surface that is concave with respect to an upper surface of the second organic layer 430. For example, the second groove GR2 may be defined by the sidewalls of the adjacent second organic patterns 430P and the upper surface 410u of the first organic layer 410 that is continuous with the sidewalls of the second organic patterns 430P. Because the first organic pattern 410P and the second organic pattern 430P are disposed in a staggered manner in the second direction (e.g., the y direction), the upper surface of the first organic pattern 410P may form a bottom surface of the second groove GR2.

The second organic layer 430 may include a light-transmitting organic material. In an embodiment, the second organic layer 430 may include acryl-based resin (e.g., poly(methyl methacrylate), polyacrylic acid, or the like), ethylhexyl acrylate, pentafluoropropyl acrylate, poly(ethylene glycol) dimethacrylate, ethylene glycol dimethacrylate), or the like. The second organic layer 430 may include a same material as the first organic layer 410.

A thickness t2 of the second organic layer 430 may be about 15 μm. For example, the thickness t2 of the second organic layer 430 may be about 10 μm to about 17 μm. A width w2 of the upper surface of the second organic pattern 430P in the second direction (e.g., the y direction) may be about 4 μm. The width w1 of the upper surface of the first organic pattern 410P in the second direction (e.g., the y direction) may be equal to the width w2 of the upper surface of the second organic pattern 430P in the second direction (e.g., the y direction). The thickness t2 of the second organic layer 430 and the width w2 of the upper surface of the second organic pattern 430P in the second direction (e.g., the y direction) may be variously modified according to a design.

The second light-shielding wall 440 may be disposed on the sidewalls of the second organic pattern 430P. For example, the second light-shielding wall 440 may cover a sidewall and a portion of a bottom surface of the second groove GR2. The second light-shielding wall 440 may include a second sidewall portion 441 and a second protruding portion 442, the second sidewall portion 441 covers the sidewalls of the second organic pattern 430P, and the second protruding portion 442 extends from the second sidewall portion 441 toward a central portion of the second groove GR2.

The second light-shielding wall 440 may include a low-reflective material. For example, the second light-shielding wall 440 may include a metal oxide. In an embodiment, the metal oxide may include at least one material selected from among MTO, CuO, CaO, MoO$_x$, and ZnO.

In an embodiment, the second light-shielding wall 440 may have a multi-layer structure. For example, the second light-shielding wall 440 may have a structure in which a metal oxide layer and a metal layer are alternately stacked with each other. In an embodiment, the second light-shielding wall 440 may have a multi-layer structure in which an MTO layer, a Mo layer, and another MTO layer are stacked, or a multi-layer structure in which an MTO layer, an Al layer, and another MTO layer are stacked. The second light-shielding wall 440 may include a same material as the first light-shielding wall 420.

The light-transmitting layer 450 may be disposed on the second organic layer 430. The light-transmitting layer 450 may fill the second groove GR2 and have a flat upper surface. The light-transmitting layer 450 may include a light-transmitting organic material. In an embodiment, the light-transmitting layer 450 may include acryl-based resin (e.g., poly(methyl methacrylate), polyacrylic acid, or the like), ethylhexyl acrylate, pentafluoropropyl acrylate, poly (ethylene glycol) dimethacrylate, ethylene glycol dimethacrylate), or the like. The light-transmitting layer 450 may include a same material as the first organic layer 410.

When viewed from a direction (e.g., the z direction) perpendicular to the upper surface of the substrate 100, the first light-shielding wall 420 and the second light-shielding wall 440 may overlap each other. An area in which the first light-shielding wall 420 and the second light-shielding wall 440 overlap each other may be defined as the light-shielding area SHA. The transmissive area TA that may be transmitted by light emitted by the organic light-emitting diode OLED may be disposed between adjacent light-shielding areas SHA.

As shown in FIG. 6, a single emission area EA may overlap the plurality of light-shielding areas SHA and the plurality of transmissive areas TA. When a component in the second direction (e.g., the y direction) of the light emitted by the organic light-emitting diode OLED exceeds a certain value and has an exit angle of greater than or equal to a cut-off angle, the emitted light may be absorbed by the first light-shielding wall 420 or the second light-shielding wall 440. Accordingly, a viewing angle of the display apparatus 1 in the second direction (e.g., the y direction) may be limited such that light emitted from the display apparatus 1 is not reflected by a vehicle window or the like and does not obstruct a driver's view.

FIGS. 7 to 12 are cross-sectional views sequentially illustrating some operations of a method of manufacturing a display apparatus, according to an embodiment.

Figure 7:
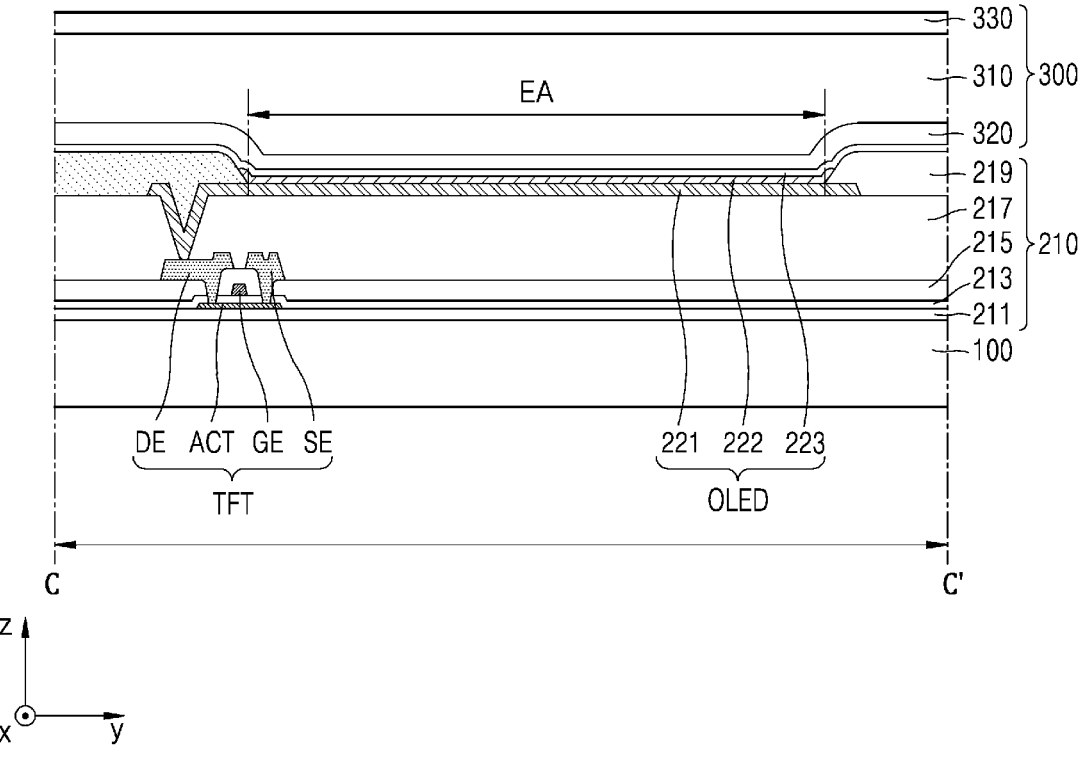
FIGS. 7 to 12 are cross-sectional views sequentially illustrating some operations of a method of manufacturing a display apparatus, according to an embodiment.

Referring to FIG. 7, the pixel circuit layer 210, the organic light-emitting diode OLED, and the encapsulation layer 300 may be sequentially formed on the substrate 100.

For example, the buffer layer 211 may be disposed on the substrate 100, and the semiconductor layer ACT of the thin-film transistor TFT may be disposed on the buffer layer 211. The gate insulating layer 213 may cover the semiconductor layer ACT, and the gate electrode GE may be disposed on the gate insulating layer 213 to overlap a partial area of the semiconductor layer ACT. The interlayer insulating layer 215 may cover the gate electrode GE, and the source electrode SE and the drain electrode DE may be disposed on the interlayer insulating layer 215. The source electrode SE and the drain electrode DE may be electrically connected to the semiconductor layer ACT through contact holes passing through the gate insulating layer 213 and the interlayer insulating layer 215.

The planarization insulating layer 217 may be disposed on the thin-film transistor TFT, and the organic light-emitting diode OLED including the pixel electrode 221, the emission layer 222, and the opposite electrode 223 may be disposed on the planarization insulating layer 217.

The pixel electrode 221 may be electrically connected to the source electrode SE or the drain electrode DE through a contact hole passing through the planarization insulating layer 217. The pixel-defining layer 219, which includes an opening exposing the upper surface of the pixel electrode 221 and covers an edge of the pixel electrode 221, may be disposed on the pixel electrode 221. The emission layer 222 may be patterned to correspond to the opening of the pixel-defining layer 219, and the opening of the pixel-defining layer 219 may define the emission layer 222 of the organic light-emitting diode OLED. The opposite electrode 223 may be integrally formed as a single body on the emission layer 222 so as to entirely cover the display area of the substrate 100.

The encapsulation layer 300 may seal the organic light-emitting diode OLED. The first inorganic encapsulation layer 310, the organic encapsulation layer 320, and the second inorganic encapsulation layer 330 may be sequentially formed, and the first inorganic encapsulation layer 310 and the second inorganic encapsulation layer 330 may be in contact with each other in the peripheral area of the substrate 100 and seal the display area of the substrate 100. The organic encapsulation layer 320 may cover unevenness due to the organic light-emitting diode OLED and provide a flat upper surface.

Figure 8:
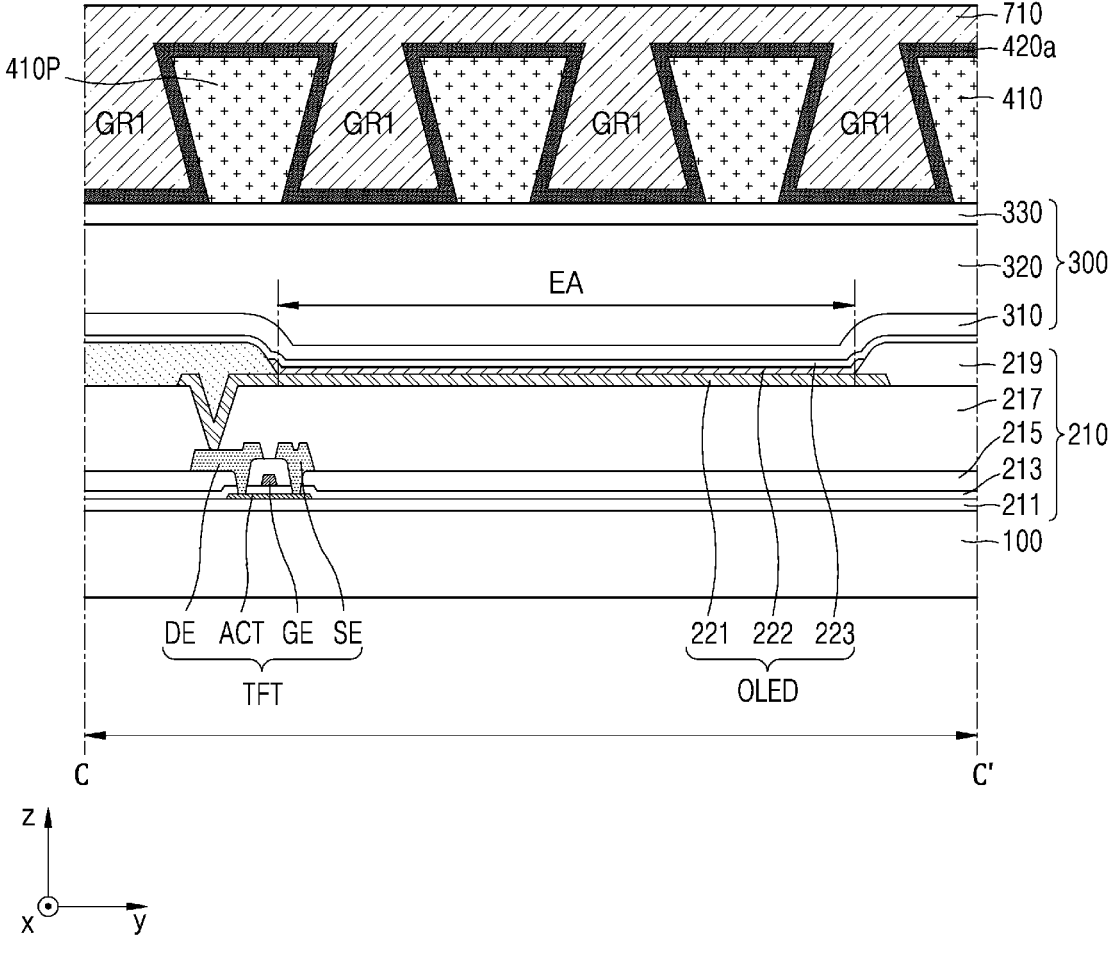

Referring to FIG. 8, the first organic layer 410 may be disposed on the encapsulation layer 300. The first organic layer 410 may include the plurality of first organic patterns 410P extending in the first direction (e.g., the x direction) and having reverse-graded sidewalls. The first organic layer 410 may be patterned through a photolithography process after applying a light-transmitting organic material thereto. The first groove GR1 may be disposed between the first organic patterns 410P.

A first light-shielding layer 420a may be disposed on the first organic layer 410. The first light-shielding layer 420a may include a low-reflective material and be formed through a sputtering process. The low-reflective material may include at least one material selected from among MTO, CuO, CaO, $MoO_x$, and ZnO. The first light-shielding layer 420a may cover the upper surface of the first organic pattern 410P, the sidewalls of the first organic pattern 410P, and the upper surface of the second inorganic encapsulation layer 330, the upper surface being exposed by the first groove GR1.

In an embodiment, the first light-shielding layer 420a may have a multi-layer structure. For example, the first light-shielding layer 420a may have a structure in which a metal oxide layer and a metal layer are alternately stacked with each other. In an embodiment, the first light-shielding layer 420a may have a multi-layer structure in which an MTO layer, a Mo layer, and another MTO layer are stacked, or a multi-layer structure in which an MTO layer, an Al layer, and another MTO layer are stacked.

A first photoresist layer 710 may cover the first light-shielding layer 420a. The first photoresist layer 710 may include a photoresist, i.e., photosensitive resin. The first photoresist layer 710 may include a positive photoresist. The first photoresist layer 710 may be formed by applying a photoresist solution onto the first light-shielding layer 420a by various methods, such as spin coating, spraying, or dipping. The first photoresist layer 710 may have a thickness sufficient to fill the first groove GR1.

Figure 9:
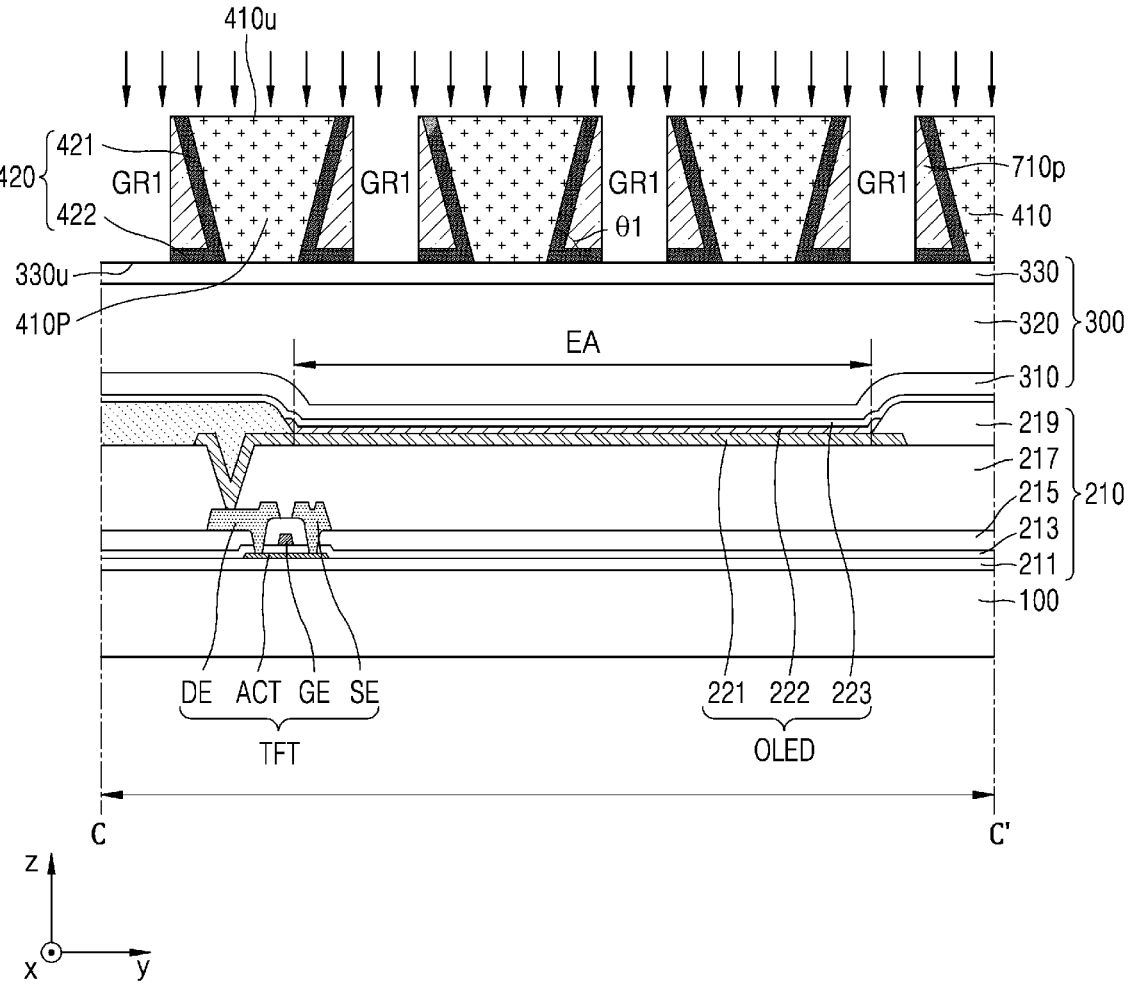

Referring to FIG. 9, the first photoresist layer 710 may be exposed by using the upper surface of the first light-shielding layer 420a as a photomask, and a first photoresist pattern 710P that is self-aligned may be formed by removing an exposed area of the first photoresist layer 710. The first photoresist pattern 710P may be disposed only in areas overlapping the upper surface of the first light-shielding layer 420a, i.e., areas adjacent to the sidewalls of the first organic pattern 410P. In this case, the first photoresist pattern 710P may remain in the bottom surface of the first groove GR1, i.e., an area in which the upper surface 330u of the second inorganic encapsulation layer 330 overlaps the upper surface of the first light-shielding layer 420*a*.

The first light-shielding wall 420 may be formed by etching the first light-shielding layer 420*a* by using the first photoresist pattern 710P as a mask. In the first light-shielding layer 420*a*, an area covered by the first photoresist pattern 710P may remain as the first light-shielding wall 420, and an area not covered by the first photoresist pattern 710P may be removed by etching. For example, the first light-shielding layer 420*a* disposed on the upper surface 410*u* of the first organic layer 410 and the first light-shielding layer 420*a* disposed on the upper surface 330*u* of the second inorganic encapsulation layer 330 not overlapping the first photoresist pattern 710P may be removed. Accordingly, the first light-shielding wall 420 may include the first sidewall portion 421 and the first protruding portion 422, wherein the first sidewall portion 421 is disposed on the sidewalls of the first organic pattern 410P, and the first protruding portion 422 is disposed on the upper surface 330*u* of the second inorganic encapsulation layer 330. Because the first light-shielding wall 420 is protected by the first photoresist pattern 710P, the first light-shielding wall 420 may maintain a relatively uniform thickness without being damaged in an etching process.

In this case, when the angle (θ1) formed by the sidewall of the first organic pattern 410P with respect to the upper surface of the substrate 100 is less than 70°, an area in which light is blocked by the first light-shielding wall 420 may be excessively increased. When the angle (θ1) formed by the sidewall of the first organic pattern 410P with respect to the upper surface of the substrate 100 is 85° or more, the first photoresist pattern 710P might not be uniformly formed, and thus, the first light-shielding wall 420 may be damaged during the etching process. The sidewall of the first organic pattern 410P may have a slope of about 70° to about 85° with respect to the upper surface of the substrate 100.

Thereafter, the first photoresist pattern 710P may be removed.

Figure 10:
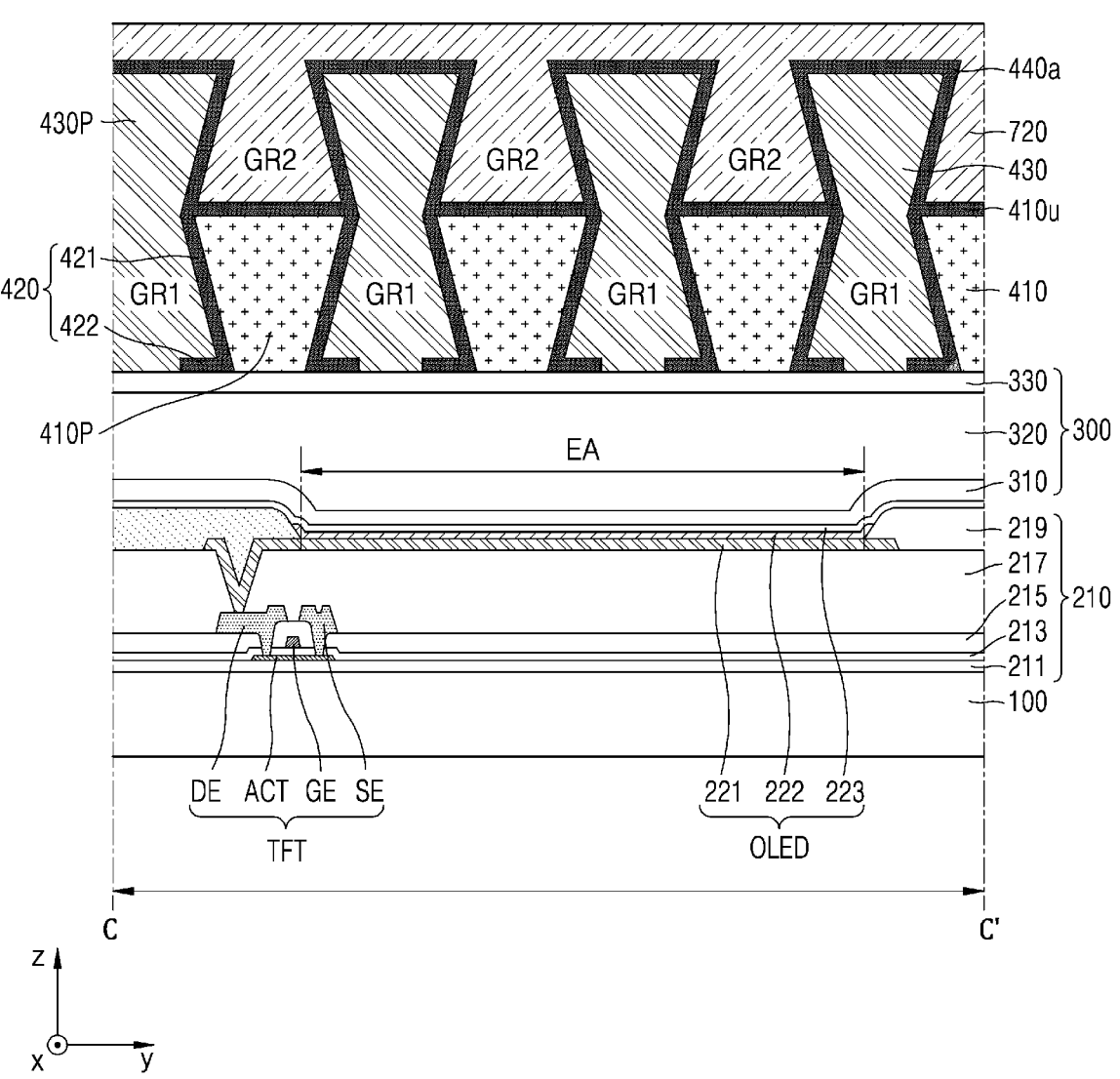
Figure 11:
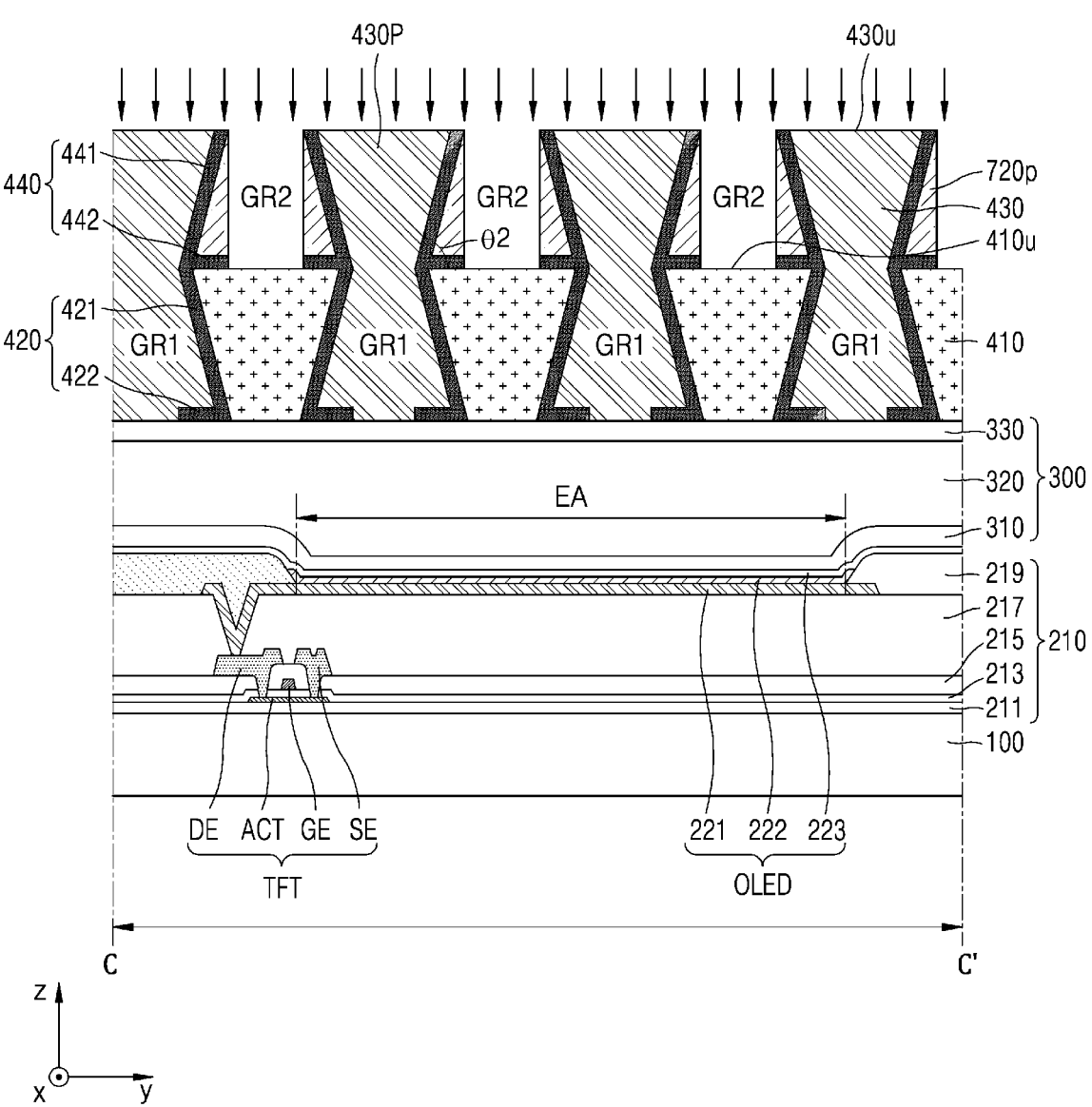

Referring to FIG. 10, the second organic layer 430 may fill the first groove GR1 and form a flat surface with the upper surface of the first organic layer 410, and the plurality of second organic patterns 430P protruding from the upper surface 410*u* of the first organic layer 410 may be disposed thereon. The second organic patterns 430P may extend in the first direction (e.g., the x direction) and have sidewalls with alternating directions of inclination. The second organic layer 430 may be patterned through a photolithography process after applying a light-transmitting organic material thereto. The second groove GR2 may be disposed between the second organic patterns 430P.

A second light-shielding layer 440*a* may be disposed on the second organic layer 430. The second light-shielding layer 440*a* may include a low-reflective material and be formed through a sputtering process. The low-reflective material may include at least one material selected from among MTO, CuO, CaO, MoO$_x$, and ZnO. The second light-shielding layer 440*a* may cover the upper surface of the second organic pattern 430P, the sidewalls of the second organic pattern 430P, and the upper surface of the first organic layer 410 exposed by the second groove GR2.

In an embodiment, the second light-shielding layer 440*a* may have a multi-layer structure. For example, the second light-shielding layer 440*a* may have a structure in which a metal oxide layer and a metal layer are alternately stacked with each other. In an embodiment, the second light-shielding layer 440*a* may have a multi-layer structure in which an MTO layer, a Mo layer, and another MTO layer are stacked, or a multi-layer structure in which an MTO layer, an Al layer, and another MTO layer are stacked.

A second photoresist layer 720 may cover the second light-shielding layer 440*a*. The second photoresist layer 720 may include a photoresist, i.e., photosensitive resin. The second photoresist layer 720 may include a positive photoresist. The second photoresist layer 720 may be formed by applying a photoresist solution onto the second light-shielding layer 440*a* by various methods, such as spin coating, spraying, or dipping. The second photoresist layer 720 may have a thickness sufficient to fill the second groove GR2.

Referring to FIG. 9, the second photoresist layer 720 may be exposed by using the upper surface of the second light-shielding layer 440*a* as a photomask, and a second photoresist pattern 720P that is self-aligned may be formed by removing an exposed area of the second photoresist layer 720. The second photoresist pattern 720P may be disposed only in areas overlapping the upper surface of the second light-shielding layer 440*a*, i.e., areas adjacent to the sidewalls of the second organic pattern 430P. In this case, the second photoresist pattern 720P may remain in the bottom surface of the second groove GR2, i.e., an area in which the upper surface 410*u* of the first organic layer 410 overlaps the upper surface of the second light-shielding layer 440*a*.

The second light-shielding wall 440 may be formed by etching the second light-shielding layer 440*a* by using the second photoresist pattern 720P as a mask. In the second light-shielding layer 440*a*, an area covered by the second photoresist pattern 720P may remain as the second light-shielding wall 440, and an area not covered by the second photoresist pattern 720P may be removed by etching. For example, the second light-shielding layer 440*a* disposed on an upper surface 430*u* of the second organic layer 430 and the second light-shielding layer 440*a* disposed on the upper surface 410*u* of the first organic layer 410 not overlapping the second photoresist pattern 720P may be removed. Accordingly, the second light-shielding wall 440 may include the second sidewall portion 441 and the second protruding portion 442, wherein the second sidewall portion 441 is disposed on the sidewalls of the second organic pattern 430P, and the second protruding portion 442 is disposed on the upper surface of the first organic pattern 410P. Because the second light-shielding wall 440 is protected by the second photoresist pattern 720P, the second light-shielding wall 440 may maintain a relatively uniform thickness without being damaged in an etching process.

In this case, when the angle (θ2) formed by the sidewall of the second organic pattern 430P with respect to the upper surface of the substrate 100 is less than 70°, an area in which light is blocked by the second light-shielding wall 440 may be excessively increased. When the angle (θ2) formed by the sidewall of the second organic pattern 430P with respect to the upper surface of the substrate 100 is 85° or more, the second photoresist pattern 720P might not be uniformly formed, and thus, the second light-shielding wall 440 may be damaged during the etching process. The sidewall of the second organic pattern 430P may have a slope of about 70° to about 85° with respect to the upper surface of the substrate 100.

Thereafter, the second photoresist pattern 720P may be removed.

Figure 12:
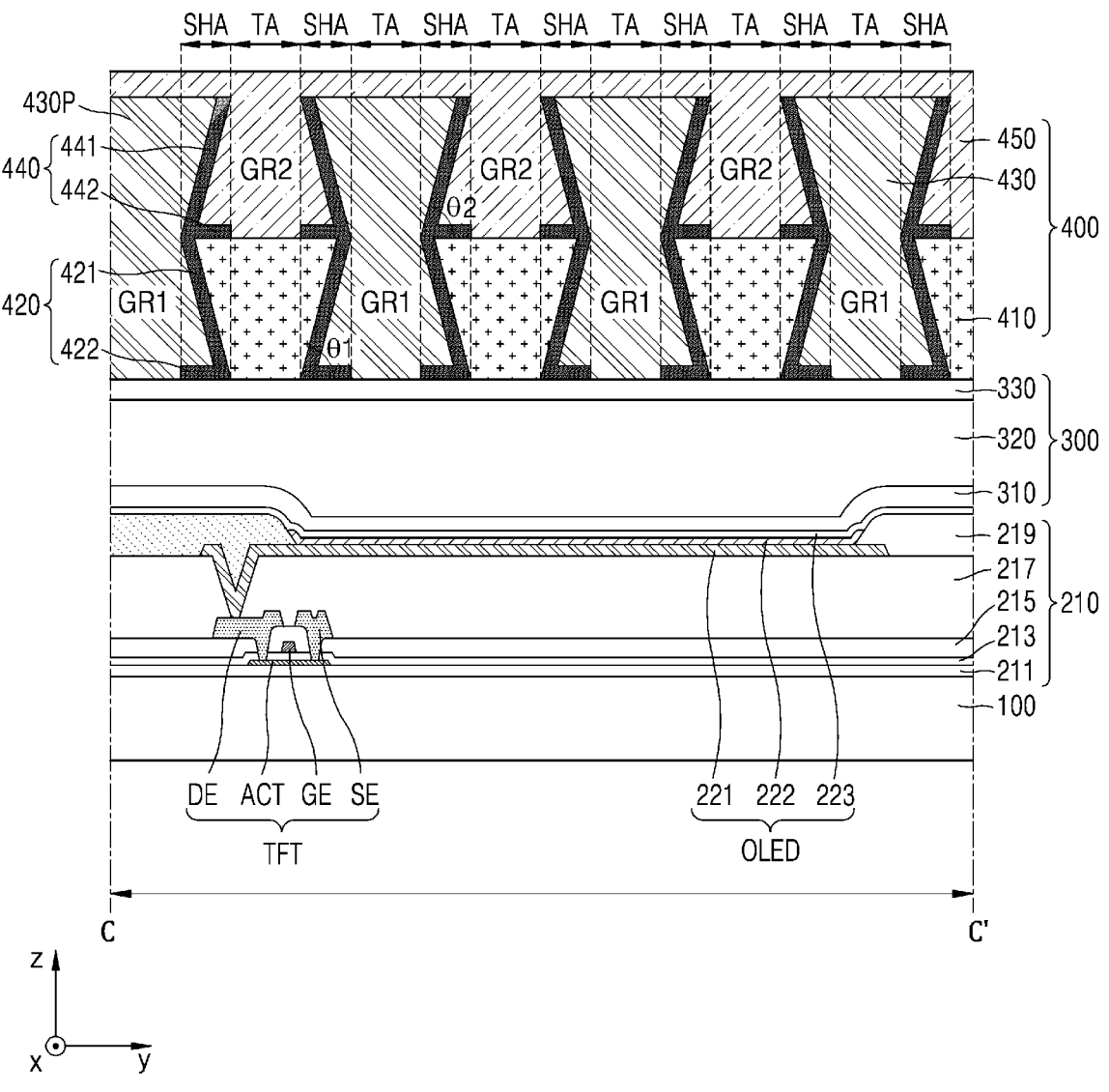

Referring to FIG. 12, the light-transmitting layer 450 may be disposed on the second organic layer 430. The light-transmitting layer 450 may completely fill the second groove GR2 such that the light-shielding layer 400 has a flat upper surface. To planarize an upper surface of the light-transmitting layer 450, chemical or mechanical polishing may be further performed.

An area in which the first light-shielding wall 420 and the second light-shielding wall 440 overlap each other may be defined as the light-shielding area SHA, in which part of light emitted by the organic light-emitting diode OLED is blocked. An area between adjacent light-shielding areas SHA may be defined as the transmissive area TA, in which the light emitted by the organic light-emitting diode OLED may transmit. An area ratio between the light-shielding area SHA and the transmissive area TA may be determined using widths of the first organic pattern 410P and the second organic pattern 430P in the second direction (e.g., they direction) and the angle (θ1) formed by the sidewall of the first organic pattern 410P with respect to the upper surface of the substrate 100 and the angle (θ2) formed by the sidewall of the second organic pattern 430P with respect to the upper surface of the substrate 100.

According to an embodiment configured as described above, a display apparatus in which a viewing angle is limited in one direction such that reflection by a vehicle window is reduced, and a method of manufacturing the display apparatus may be implemented. However, the scope of the disclosure is not necessarily limited by this effect.

Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A display apparatus, comprising:
   a substrate;
   a display element disposed on the substrate;
   a first organic layer disposed on the display element and including a plurality of first organic patterns, the plurality of first organic patterns extending in a first direction and having reverse-graded sidewalls;
   a plurality of first light-shielding walls disposed on the sidewalls of the plurality of first organic patterns;
   a second organic layer disposed on the first organic layer and including a plurality of second organic patterns, the plurality of second organic patterns extending in the first direction and having sidewalls with alternating directions of inclination; and
   a plurality of second light-shielding walls disposed at the sidewalls of the plurality of second organic patterns,
   wherein neighboring first light-shielding walls of the plurality of first light-shielding walls are spaced apart from each other in an area between neighboring first organic patterns of the plurality of first organic patterns.

2. The display apparatus of claim 1, wherein the plurality of first organic patterns and the plurality of second organic patterns are disposed in a staggered manner in a second direction crossing the first direction.

3. The display apparatus of claim 1, wherein the first organic layer includes a first groove disposed between adjacent first organic patterns, of the plurality of first organic patterns, and having a bottom surface that is concave with respect to an upper surface of the plurality of first organic patterns, and
   wherein first light-shielding walls disposed on sidewalls of the adjacent first organic patterns cover part of the bottom surface of the first groove.

4. The display apparatus of claim 3, wherein the second organic layer fills the first groove.

5. The display apparatus of claim 1, wherein the second organic layer includes a second groove disposed between adjacent second organic patterns, of the plurality of second organic patterns, and having a bottom surface that is concave with respect to an upper surface of the plurality of second organic patterns, and
   wherein second light-shielding walls disposed on sidewalls of the adjacent second organic patterns, of the plurality of second organic patterns, cover part of the bottom surface of the second groove.

6. The display apparatus of claim 5, wherein the bottom surface of the second groove includes an upper surface of the first organic patterns.

7. A display apparatus, comprising:
   a substrate;
   a display element disposed on the substrate;
   a first organic layer disposed on the display element and including a plurality of first organic patterns, the plurality of first organic patterns extending in a first direction and having reverse-graded sidewalls;
   a plurality of first light-shielding walls disposed on the sidewalls of the plurality of first organic patterns;
   a second organic layer disposed on the first organic layer and including a plurality of second organic patterns, the plurality of second organic patterns extending in the first direction and having sidewalls with alternating directions of inclination; and
   a plurality of second light-shielding walls disposed at the sidewalls of the plurality of second organic patterns,
   wherein the first light-shielding wall and the second light-shielding wall include a metal oxide.

8. The display apparatus of claim 1, wherein a slope formed by each of the sidewalls of the plurality of first organic patterns and the sidewalls of the plurality of second organic patterns with respect to an upper surface of the substrate is 70° or more.

9. The display apparatus of claim 1, further comprising a light-transmitting layer disposed on the second organic layer.

10. The display apparatus of claim 1, wherein, when viewed from a direction perpendicular to the substrate, the plurality of first light-shielding walls and the plurality of second light-shielding walls overlap each other.

11. A method of manufacturing a display apparatus, the method comprising:
   preparing a substrate on which a display element is disposed;
   forming a first organic layer on the display element, the first organic layer including a plurality of first organic patterns extending in a first direction and having sidewalls with alternating directions of inclination;
   forming a first light-shielding layer covering the plurality of first organic patterns;
   forming a plurality of first light-shielding layers on the sidewalls of the plurality of first organic patterns by etching the first light-shielding layer;
   forming a second organic layer on the first organic layer, the second organic layer including a plurality of second organic patterns extending in the first direction and having reverse-graded sidewalls;
   forming a second light-shielding layer covering the plurality of second organic patterns; and
   forming a plurality of second light-shielding walls on the sidewalls of the plurality of second organic patterns by etching the second light-shielding layer.

12. The method of claim 11, wherein the first organic layer includes a first groove disposed between adjacent first organic patterns and having a bottom surface that is concave with respect to an upper surface of the first organic patterns, and wherein in the forming of the second organic layer, the second organic layer fills the first groove.

13. The method of claim 12, wherein first light-shielding walls disposed on sidewalls of the adjacent first organic patterns cover part of the bottom surface of the first groove.

14. The method of claim 11, wherein the plurality of first organic patterns and the plurality of second organic patterns are disposed in a staggered manner in a second direction crossing the first direction.

15. The method of claim 11, wherein the second organic layer includes a second groove disposed between adjacent second organic patterns, of the plurality of second organic patterns, and having a bottom surface that is concave with respect to an upper surface of the second organic patterns, and wherein second light-shielding walls disposed on sidewalls of the adjacent second organic patterns cover part of the bottom surface of the second groove.

16. The method of claim 11, wherein the forming of the first light-shielding wall includes:

forming a first photoresist layer covering the first light-shielding layer;

forming a first photoresist pattern in an area overlapping an upper surface of the first light-shielding layer by using the upper surface of the first light-shielding layer as a mask;

etching the first light-shielding layer by using the first photoresist pattern as a mask; and removing the first photoresist pattern.

17. The method of claim 11, wherein the forming of the second light-shielding wall includes:

forming a second photoresist layer covering the second light-shielding layer;

forming a second photoresist pattern in an area overlapping an upper surface of the second light-shielding layer by using the upper surface of the second light-shielding layer as a mask;

etching the second light-shielding layer by using the second photoresist pattern as a mask; and removing the second photoresist pattern.

18. The method of claim 11, wherein each of the sidewalls of the plurality of first organic patterns and each of the sidewalls of the plurality of second organic patterns forms a slope of 70° or more with respect to an upper surface of the substrate.

19. The method of claim 11, wherein the first light-shielding layer and the second light-shielding layer include a metal oxide.

20. The method of claim 11, further comprising forming a light-transmitting layer disposed on the second organic layer.

* * * * *